(12) United States Patent
Masumura et al.

(10) Patent No.: US 7,371,703 B2
(45) Date of Patent: May 13, 2008

(54) OPTICAL GLASS SUFFERING LITTLE CHANGE IN REFRACTIVE INDEX BY RADIATION OF LIGHT

(75) Inventors: Akira Masumura, Sagamihara (JP); Muneo Nakahara, Sagamihara (JP); Satoru Matsumoto, Sagamihara (JP); Tatsuya Senoo, Sagamihara (JP)

(73) Assignee: Kabushiki Kaisha Ohara, Kanagawa-ken (JP)

( * ) Notice: Subject to any disclaimer, the term of this patent is extended or adjusted under 35 U.S.C. 154(b) by 350 days.

(21) Appl. No.: 10/666,232

(22) Filed: Sep. 18, 2003

(65) Prior Publication Data

US 2004/0063563 A1 Apr. 1, 2004

Related U.S. Application Data

(62) Division of application No. 09/872,842, filed on Jun. 1, 2001, now Pat. No. 7,196,027.

(30) Foreign Application Priority Data

Jun. 5, 2000 (JP) ............................. 2000-167377
Oct. 30, 2000 (JP) ............................. 2000-330066

(51) Int. Cl.
*C03C 3/247* (2006.01)
*C03C 3/16* (2006.01)
*C03C 3/17* (2006.01)
*C03C 3/102* (2006.01)

(52) U.S. Cl. ............................. 501/44; 501/45; 501/46; 501/48

(58) Field of Classification Search ............ 501/44–46, 501/48
See application file for complete search history.

(56) References Cited

U.S. PATENT DOCUMENTS

| 3,671,276 | A | * | 6/1972 | Bromer et al. ................. 501/44 |
| 4,358,543 | A | * | 11/1982 | Nozawa ....................... 501/40 |
| 4,808,556 | A | * | 2/1989 | Sawanobori et al. .......... 501/44 |
| 4,915,721 | A | * | 4/1990 | Broemer et al. ............... 65/66 |
| 4,990,468 | A | * | 2/1991 | Komiya et al. ............... 501/44 |
| 5,017,520 | A | * | 5/1991 | Otsuka et al. ................ 501/44 |

* cited by examiner

*Primary Examiner*—Karl E Group
(74) *Attorney, Agent, or Firm*—James V. Costigan; Hedman & Costigan, P.C.

(57) ABSTRACT

An optical glass wherein an amount of change in refractive index (Δn: difference in refractive index between a state before radiation and a state after radiation) caused by radiation of laser beam at wavelength of 351 nm having average output power of 0.43 W, pulse repetition rate of 5 kHz and pulse width of 400 ns for one hour is 5 ppm or below is provided. The optical glass comprises a fluorine ingredient and/or a titanium oxide ingredient and/or an arsenic oxide ingredient. The optical glass suffers little change in refractive index by radiation of strong light having wavelengths of 300 nm to 400 nm such as ultraviolet laser.

7 Claims, No Drawings

OPTICAL GLASS SUFFERING LITTLE CHANGE IN REFRACTIVE INDEX BY RADIATION OF LIGHT

This application is a division of Ser. No. 09/872,842, filed Jun. 1, 2001 now U.S. Pat. No. 7,196,027, which claims priority from Japanese Application Ser. No. 2000-167377, filed Jun. 5, 2000 and Japanese Application Ser. No. 2000-330066, filed Oct. 30, 2000.

BACKGROUND OF THE INVENTION

This invention relates to an optical glass used in the near ultraviolet region and, more particularly, to an optical glass which suffers little change in refractive index by radiation of strong light having wavelengths of 300 nm to 400 nm (e.g., super high pressure mercury vapor lamp and ultraviolet laser).

As an optical system using near ultraviolet rays, known in the art is an optical lithography for exposing and copying a fine pattern of an integrated circuit on a wafer such as a silicon wafer, i.e., an exposure device called i-line stepper using the i-line (365 nm) of a super high pressure mercury vapor lamp. In this exposure device, there is an increasing tendency to expanding the exposure area with increase in integration in LSI. In an optical system of the i-line stepper, lenses having a diameter of 200 mm or over is generally used. The optical glass for i-line used for these lenses are required to have very high homogeneity, to have internal transmittance for i-line of 99% or over in glass having thickness of 10 mm and to be free from deterioration due to ultraviolet radiation, i.e., solarization.

For this reason, the optical glasses for i-line are produced on the basis of established technique including adoption of high purity materials including little impurities, use of cleaner steps for mixing and melting of materials and removal of strain by highly-homogeneous melting and precision annealing.

However, as integration of LSI tends to increase further, it is desired for the i-line stepper to have improved exposure and copying capabilities and durability over a long period of time and optical lenses used for the i-line stepper are desired to have high homogeneity, high transmittance, resistivity to solarization and also resistivity to the i-line radiation, namely little change in refractive index by i-line radiation.

As to change in refractive index by radiation of light, there is a phenomenon called the compaction phenomenon in which synthetic quartz glass undergoes changes in transmittance and density by radiation of excimer laser beam of a high level over a long period of time with resulting change in refractive index and the shape of glass surface.

The synthetic quartz glass is produced by synthesizing silicon oxide in the form of fine powder by burning silicon tetrachloride with oxyhydrogen flame and sintering this silicon oxide powder by heating it at a high temperature. That is, it is synthesized by the reaction:

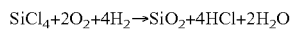

$SiCl_4 + 2O_2 + 4H_2 \rightarrow SiO_2 + 4HCl + 2H_2O$

The compaction phenomenon is considered to occur due to ions ($OH^-$ and $H^+$) derived from water content remaining in the synthesized quartz glass and/or cutting of the Si—O bond caused by incompleteness of reaction.

In the optical glasses for i-line offered for the i-line radiation, occurrence of the compaction phenomenon has not been specifically known.

It has unexpectedly been found that, in the optical glass for i-line, deterioration in homogeneity due to change in refractive index and increase in strain, and deformation in the shape of the glass surface take place, in the same manner as was known in synthetic quartz glass, in a portion where ultraviolet ray or laser beam of a high level within the wavelength range from 300 nm to 400 nm has been radiated and, therefore, the optical glass for i-line does not possess sufficient resistivity to light. An optical system using such optical glasses, therefore, tend to produce deterioration in image quality which will cause a problem in further increase in integration of LSI and improvement in the exposure and copying capabilities of the i-line stepper.

For example, PBL1Y which is an optical glass for i-line made by Ohara K. K. has undergone change in refractive index ($\Delta n$) of $\Delta n = +9.0 \times 10^{-6}$ in a portion where laser beam having wavelength of 355 nm has been radiated by a Q-switch pulse solid laser under conditions of output of 1.2 W, beam diameter of 2.6 mm, radiation time of 3 hours and total pulse number of $5.4 \times 10^7$ pulses.

It is, therefore, an object of the present invention to provide an optical glass having excellent resistivity to change by radiation of light in which change in refractive index caused by radiation of ultraviolet ray or laser beam of a high level having wavelengths within a range from 300 nm to 400 nm is restrained.

SUMMARY OF THE INVENTION

Studies and experiments made by the inventors of the present invention for achieving the above described object of the invention have resulted in the finding, which has led to the invention, that addition of fluorine ingredient and/or titanium oxide ingredient and/or arsenic oxide ingredient as a glass component unexpectedly has an effect of restraining change in refractive index by radiation of light. More specifically, a glass which suffers little change in refractive index by radiation of ultraviolet ray can be obtained by (1) in a $SiO_2$—PbO-alkali metal oxide glass, addition of a relatively small amount of fluorine ingredient, and/or addition of $As_2O_3$ ingredient as a refining agent instead of $Sb_2O_3$ ingredient, and/or addition of $TiO_2$ ingredient the amount of which is so small that influence to transmittance can be ignored, (2) in a $SiO_2$—$B_2O_3$-alkali metal oxide and/or an alkaline earth metal oxide glass, addition of fluorine ingredient, and/or addition of $As_2O_3$ ingredient as a refining agent instead of $Sb_2O_3$ ingredient, and/or addition of $TiO_2$ ingredient the amount of which is so small that influence to transmittance can be ignored and (3) in a $P_2O_5$—$Al_2O_3$-alkaline earth fluoride glass, non-addition of a refining agent and $TiO_2$ ingredient, or addition of a very small amount of at least one of these ingredients.

For achieving the above described object of the invention, there is provided an optical glass wherein an amount of change in refractive index ($\Delta n$: difference in refractive index between a state before radiation and a state after radiation) caused by radiation of laser beam at wavelength of 351 nm having average output power of 0.43 W, pulse repetition rate of 5 kHz and pulse width of 400 ns for one hour is 5 ppm or below.

In one aspect of the invention, the optical glass comprises a fluorine ingredient, and/or a titanium oxide ingredient, and/or an arsenic oxide ingredient.

In another aspect of the invention, the optical glass comprises, in mass %, a total amount of 0.1-45% of F in one or more fluorides as the fluorine ingredient, and/or 0.001-0.5% of $TiO_2$ as the titanium oxide ingredient, and/or 0.001-1% of $As_2O_3$ as the arsenic oxide ingredient.

In another aspect of the invention, the optical glass comprises, in mass %,

| | |
|---|---|
| SiO₂ | 40-70% |
| PbO | 14-50% |
| Na₂O and/or K₂O in the total amount of | 8-17% |
| where | |
| Na₂O | 0-14% |
| and | |
| K₂O | 0-15% |
| B₂O₃ | 0-5% |
| As₂O₃ | 0-1% |
| Sb₂O₃ | 0-1% |
| TiO₂ | 0-0.2% and | fluoride or fluorides substituting for the above oxide or oxides partially or entirely, a total amount of F contained in the fluoride or fluorides being 0-2%.

In another aspect of the invention, the optical glass comprises, in mass %,

| | |
|---|---|
| SiO₂ | 30-70% |
| B₂O₃ | 3-20% |
| Al₂O₃ | 0-6% |
| Li₂O | 0-5% |
| Na₂O + K₂O + BaO + ZnO in the total amount of | 10-45% |
| where | |
| Na₂O | 0-13% |
| K₂O | 0-12% |
| BaO | 0-42% |
| and | |
| ZnO | 0-7% |
| PbO | 0-2% |
| TiO₂ | 0-0.5% |
| As₂O₃ | 0-1% |
| Sb₂O₃ | 0-1% and | fluoride or fluorides substituting for the above oxide or oxides partially or entirely, a total amount of F contained in the fluoride or fluorides being 0-11%.

In another aspect of the invention, the above described SiO₂—PbO optical glass comprises, in mass %,

| | |
|---|---|
| Li₂O | 0-2% |
| CaO | 0-2% |
| SrO | 0-2% |
| BaO | 0-5% |
| Al₂O₃ | 0-2% | the total amount of one or more of the Li₂O, CaO, SrO, BaO and Al₂O₃ ingredients being 5% or below.

In another aspect of the invention, the above described SiO₂—B₂O₃ optical glass comprises, in mass %,

| | |
|---|---|
| CaO | 0-2% |
| SrO | 0-2% |
| ZrO₂ | 0-2% | the total amount of one or more of the CaO, SrO and ZrO₂ ingredients being 2% or below.

In another aspect of the invention, the optical glass comprises, in mass %,

| | |
|---|---|
| P₂O₅ | 4-39% |
| Al₂O₃ | 0-9% |
| MgO | 0-5% |
| CaO | 0-6% |
| SrO | 0-9% |
| BaO | 0-10% |
| Y₂O₃ + La₂O₃ + Gd₂O₃ + Yb₂O₃ in the total amount of | 0-20% |
| Where | |
| Y₂O₃ | 0-10% |
| La₂O₃ | 0-10% |
| Gd₂O₃ | 0-20% |
| and | |
| Yb₂O₃ | 0-10% |
| TiO₂ | 0-0.1% |
| SnO₂ | 0-1% |
| As₂O₃ | 0-0.5% |
| Sb₂O₃ | 0-0.5% |
| AlF₃ | 0-29% |
| MgF₂ | 0-8% |
| CaF₂ | 0-27% |
| SrF₂ | 0-27% |
| BaF₂ | 10-47% |
| YF₃ | 0-10% |
| LaF₃ | 0-10% |
| GdF₃ | 0-10% |
| LiF | 0-3% |
| NaF | 0-1% |
| KF | 0-1% | the total amount of F in one or more of the fluorides being 10-45% and the total amount of one or more of MgF₂, CaF₂, SrF₂ and BaF₂ being 30-70%.

DETAILED DESCRIPTION OF THE INVENTION

First, reason for defining an amount of change in refractive index ($\Delta n$: difference in refractive index between a state before radiation and a state after radiation) caused by radiation of laser beam at wavelength of 351 nm having average output power of 0.43 W, pulse repetition rate of 5 kHz and pulse width of 400 ns for one hour to be 5 ppm or below will be described.

Studies and experiments conducted by the inventors of the present invention have revealed that a glass which satisfies the above described condition, when it is exposed to radiation of ultraviolet ray of a high output power or continuous laser beam in a wavelength region of 300 nm-400 nm, does not cause deterioration in homogeneity, distortion or deformation in the glass surface shape due to change in refractive index but maintains sufficient resistance to light for use as an optical glass for I-line and, therefore, an optical system using this glass does not deteriorate image quality but can increase integration of LSI and improve the exposure and copying capabilities.

Reasons for limiting the composition ranges of the respective ingredients in the optical glass of the invention as described above will now be described.

In the SiO₂—PbO-alkali metal oxide glass, the SiO₂ ingredient is an indispensable ingredient for forming glass and can impart the glass with properties which are peculiar to the SiO₂—PbO glass by combination with the PbO ingredient. If the amount of this ingredient is less than 40%, refractive index tends to become excessively high and transmittance becomes insufficient in a short wavelength region which is unsuitable for an optical system using i-line such as an i-line exposure device. If the amount of this ingredient exceeds 70%, viscosity of the glass becomes too high with resulting difficulty in providing a homogeneous glass.

The PbO ingredient is effective for producing a high-refractive, high dispersion glass and for properly dropping viscosity of the glass. If the amount of this ingredient is less than 14%, the glass becomes hard and it becomes difficult to provide a homogeneous glass. If the amount of this ingredient exceeds 50%, refractive index becomes too high and it becomes difficult to obtain sufficiently high transmittance in a short wavelength region.

The $Na_2O$ and $K_2O$ ingredients are effective for accelerate melting of the $SiO_2$ and PbO ingredients in glass materials and adjusting viscosity of the glass. If the amount of the $Na_2O$ ingredient exceeds 14% or the amount of the $K_2O$ ingredient exceeds 15%, it is undesirable because chemical properties of the glass such as weather-proof property and acid-proof property are deteriorated. If the total amount of these ingredients is less than 8%, the above described effects cannot be achieved sufficiently and, therefore, viscosity of the glass becomes too high to obtain a homogeneous glass. If the total amount of these ingredient exceeds 17%, the chemical properties of the glass such as weather-proof property and acid-proof property are deteriorated.

The $B_2O_3$ ingredient may be added as an optional ingredient. This ingredient functions as a glass forming ingredient in the same manner as the $SiO_2$ ingredient. If, however, this ingredient is added in a large amount in the $SiO_2$—PbO-alkali metal glass, it tends to cause deterioration in the chemical properties and, therefore, the amount of this ingredient should preferably be 5% or less.

The $As_2O_3$ and $Sb_2O_3$ ingredients are effective as refining aids for the glass and, besides, the $As_2O_3$ ingredient is effective for restraining the compaction phenomenon in the glass and, therefore, these ingredients may be added as optional ingredients. For attaining these effects, addition of each ingredient in an amount up to 1% will suffice. In a case where neither the fluorine ingredient nor the $TiO_2$ ingredient is present in the $SiO_2$—PbO-alkali metal oxide glass, the $As_2O_3$ ingredient should be added in an amount of 0.001-1% in order to minimize the change in refractive index due to the compaction phenomenon.

The $TiO_2$ ingredient is effective for adjusting refractive index and Abbe number of the glass, and restraining the compaction phenomenon and solarization due to radiation of ultraviolet ray or laser beam of a high-level. If a large amount of this ingredient is added, transmittance in the short wavelength region is deteriorated and, therefore, the amount of this ingredient should preferably be 0.2% or less. In a case where neither the fluorine ingredient nor the $As_2O_3$ ingredient is present in the $SiO_2$—PbO-alkali metal glass, the $TiO_2$ ingredient should be added in an amount of 0.001-0.2% in order to minimize the change in refractive index due to the compaction phenomenon.

The fluorine ingredient may be added as an optional ingredient as fluoride or fluorides substituting for the above described oxide or oxides partially or entirely. This ingredient is effective for restraining the compaction phenomenon of the glass due to radiation of ultraviolet ray or laser beam of a high level, and adjusting refractive index and viscosity of the glass. If the total amount of fluorine contained in the fluoride or fluorides exceeds 2%, volatilization of the fluorine ingredient becomes excessive with resulting difficulty in providing a homogeneous glass. In a case where neither the $As_2O_3$ ingredient nor the $TiO_2$ ingredient is present in the $SiO_2$—PbO-alkali metal oxide glass, the fluorine ingredient should be added in a total amount of 0.1-2% in order to minimize the change in refractive index due to the compaction phenomenon.

In the $SiO_2$—PbO-alkali metal oxide glass of the invention, the $Li_2O$, CaO, SrO and $Al_2O_3$ ingredients may be added as optional ingredients up to 2% respectively and the BaO ingredient may be added as an optional ingredient up to 5% in order to adjust viscosity, refractive index, chemical properties and stability of the glass. The total amount of one or more of the $Li_2O$, CaO, SrO, $Al_2O_3$ and BaO ingredients should be 5% or below.

In the $SiO_2$—$B_2O_3$-alkali metal oxide and/or alkaline earth metal oxide glass, the $SiO_2$ ingredient is an indispensable ingredient for forming of the glass in the same manner as in the case of $SiO_2$—PbO-alkali metal oxide glass. If the amount of this ingredient is less than 30%, it is undesirable because a relatively large amount of $B_2O_3$ and BaO ingredients is required and, moreover, refractive index becomes too high and the chemical properties are deteriorated. If the amount of this ingredient exceeds 70%, viscosity of the glass becomes too high with resulting difficulty in providing a homogeneous glass.

The $B_2O_3$ ingredient is, like the $SiO_2$ ingredient, an oxide which forms the glass and is effective for making a low dispersion glass and adjusting viscosity of the glass. If the amount of this ingredient is less than 3%, these effects cannot be achieved sufficiently. If the amount of this ingredient exceeds 20%, it is undesirable because the chemical properties are deteriorated. The $Al_2O_3$ ingredient is effective for improving chemical properties of the glass, and adjusting viscosity and refractive index of the glass. If the amount of this ingredient exceeds 6%, viscosity of the glass becomes too high.

The $Li_2O$ ingredient is effective for accelerating melting of glass materials, and it is less likely to causes decrease in refractive index and deterioration in chemical properties than in other alkali metal oxides. If the amount of this ingredient exceeds 5%, it is undesirable because devitrification of the glass increases.

The $Na_2O$ and $K_2O$ ingredients are effective for accelerating melting of glass materials and a stable glass can be produced even in case these ingredients are added in a large amount. If, however, the amounts of the $Na_2O$ ingredient and the $K_2O$ ingredient exceed 13% and 12% respectively, it is undesirable because chemical properties are deteriorated.

The BaO ingredient is effective for improving refractive index without excessively increasing dispersion of the glass (i.e., without excessively decreasing Abbe number) and providing a stable glass having high resistivity to devitrification over a wide range of glass composition. If the amount of this ingredient exceeds 42%, chemical properties of the glass is extremely deteriorated.

The ZnO ingredient is effective for improving refractive index, adjusting viscosity and improving resistivity to devitrification. If the amount of this ingredient exceeds 7%, it is undesirable because decrease in transmittance in the short wavelength region tends to result.

For obtaining a glass which is stable, has excellent chemical properties and has excellent transmittance even in the short wavelength region, the total amount of one or more of the $Na_2O$ ingredient, the $K_2O$ ingredient, the BaO ingredient and the ZnO ingredient should preferably be 10-45%.

The PbO ingredient and the $TiO_2$ ingredient are effective for preventing solarization in the $SiO_2$—$B_2O_3$-alkali metal oxide and/or alkaline earth metal oxide glass. Further, the $TiO_2$ ingredient is effective for restraining the compaction phenomenon. Addition of excessive amounts of these ingredients, however, causes deterioration in transmittance in the short wavelength region and, therefore, the amounts of these ingredients should preferably be up to 2% and 0.5% respectively. In a case where neither the fluorine ingredient nor the $As_2O_3$ ingredient is present in the $SiO_2$—$B_2O_3$-alkali metal oxide and/or alkaline earth metal oxide glass, the $TiO_2$ ingredient should be added in an amount of 0.001-0.5% for minimizing the change in refractive index caused by the compaction phenomenon.

The $As_2O_3$ ingredient and the $Sb_2O_3$ ingredients are effective as refining aids for the glass and, further, the $As_2O_3$ is effective for restraining the compaction phenomenon of the glass and, therefore, these ingredients may be added as optional ingredients. For attaining these effects, however, it will suffice if these ingredients are added up to 1% respectively. In a case where neither the fluorine ingredient nor the $TiO_2$ ingredient is present in the $SiO_2$—PbO-alkali metal oxide and/or alkaline earth metal oxide glass, the $As_2O_3$ ingredient should be added in an amount of 0.001-1% for minimizing the change in refractive index caused by the compaction phenomenon.

The fluorine ingredient may be added as an optional ingredient as fluoride or fluorides substituting for the above described oxide or oxides partially or entirely. This ingredient is effective for restraining the compaction phenomenon of the glass due to radiation of ultraviolet ray or laser beam of a high level, and adjusting refractive index and viscosity of the glass. If the total amount of fluorine contained in the fluoride or fluorides exceeds 11%, the glass tends to become opaque, refractive index becomes too low and volatilization of the fluorine ingredient becomes excessive with resulting difficulty in obtaining a homogeneous glass. In a case where neither the $As_2O_{3\_}$ ingredient nor the $TiO_2$ ingredient is present in the $SiO_2$—PbO-alkali metal oxide glass, the fluorine ingredient should be added in a total amount of 0.1-11% in order to minimize the change in refractive index due to the compaction phenomenon.

In addition to the above described ingredients, one or more of the CaO ingredient, SrO ingredient and $ZrO_2$ ingredient may be added in a total amount of up to 2%.

In the $P_2O_5$—$Al_2O_3$-alkaline earth fluoride glass, the $P_2O_5$ ingredient is a glass forming ingredient. If the amount of this ingredient is less than 4%, it is difficult to provide a stable glass having excellent resistivity to devitrification. If the amount of this ingredient exceeds 39%, the Abbe number becomes too small and the low dispersion characteristic which is an advantageous feature of the composition of the invention becomes difficult to attain.

The $Al_2O_3$ ingredient is an ingredient which, by coexistence with the $P_2O_5$ ingredient, forms the structure of the glass and also is effective for improving chemical properties of the glass. If the amount of this ingredient exceeds 9%, devitrification increases.

The MgO, CaO, SrO and BaO ingredients included in the glass in the form of phosphates are beneficial for improving stability and chemical properties of the glass and adjusting refractive index and Abbe number. If the amounts of these ingredients exceed 5%, 6%, 9% and 10% respectively, it is undesirable because devitriifcation tends to increase rather than decrease. For making a glass which is not likely to cause devitrification, a total amount of one or more of these ingredients should preferably be 20% or below.

The $Y_2O_3$, $La_2O_3$, $Gd_2O_3$ and $Yb_2O_3$ ingredients are effective for increasing refractive index without decreasing the Abbe number, preventing occurrence of devitrification and improving chemical properties of the glass. If the amounts of these ingredients exceed 10%, 10%, 20% and 10% respectively, it is undesirable because reistivity to devitrification is deteriorated. If the total amount of one or more of these ingredients exceed 20%, it is undesirable because resistivity to devitrification is deteriorated.

The $TiO_2$ ingredient is effective for improving refractive index of the glass, preventing solarization and minimaizing the change in refractive index due to the compaction phenomenon. For these reasons, it may be added as required as an optional ingredient. It will suffice if this ingredient is added in an amount of 0.1% or below. Addition of this ingredient in excess of 0.1% is undesirable because it will cause deterioration in transmittance of the glass in the short wavelength region.

The $SnO_2$ ingredient is effective for improving refractive index of the glass and preventing devitrification. It will suffice if this ingredient is added in an amount of 1% or below.

The $As_2O_3$ ingredient and the $Sb_2O_3$ ingredients are effective as refining aids for the glass and, further, the $As_2O_3$ is effective for restraining the compaction phenomenon of the glass and, therefore, these ingredients may be added as optional ingredients. For attaining these effects, however, it will suffice if these ingredients are added up to 0.5% respectively.

The $AlF_3$ ingredient is effective for decreasing dispersion of the glass and preventing devitrification. If the amount of this ingredient exceeds 29%, the stability of the glass is deteriorated and crystals tend to precipitate in the glass.

The $MgF_2$, $CaF_2$, $SrF_2$ and $BaF_2$ ingredients are effective for preventing devitrification of the glass. If the amount of the $BaF_2$ ingredient is less than 10%, it becomes difficult to obtain a chemically stable glass. If the amounts of the $MgF_2$, $CaF_2$, $SrF_2$ and $BaF_2$ exceed 8%, 27%, 27% and 47% respectively, devitrification increases rather than decreases. A proper total amount of one or more of the $MgF_2$, $CaF_2$, $SrF_2$ and $BaF_2$ ingredients is 30-70%.

The $YF_3$, $LaF_3$ and $GdF_3$ ingredients are effective for increasing refractive index and improving resistivity to devitrification. Addition of each of these ingredients up to 10% will suffice.

The LiF, NaF and KF are effective for improving resistivity to devitrification. Addition of these ingredients in amounts exceeding 3%, 1% and 1% respectively is not proper because it will increase devitrification rather than decrease it.

In the $P_2O_5$—$Al_{2\_}O_3$-alkaline earth fluoride glass, it is proper that a total amount of F contained in the fluoride or fluorides should be 10-45% in order to minimize the change in refractive index of the glass due to the compaction phenomenon. The above described oxides may be substituted by fluorides and the above described fluorides may be substituted by oxides within a range in which the ratio of metal ion, oxygen ion and fluorine ion of the respective oxides and fluorides is maintained.

EXAMPLES

Examples of the optical glass made according to the invention will now be described. Examples No. 1 to No. 24 shown in Tables 1 to 4 are examples of composition of the $SiO_2$—PbO-alkali metal oxide glass of the present invention. Examples No. 25 to No. 38 shown in Tables 5 and 6 are examples of composition of the $SiO_2$—$B_2O_3$-alkali metal oxide and/or alkaline earth metal oxide glass of the present invention. Examples No. 39 to 58 shown in Tables 7 to 9 are examples of composition of the $P_2O_5$—$Al_2O_3$-alkaline earth metal fluoride glass of the present invention.

Table 10 shows comparison (Comparison I and Comparison II) between Examples No. 59 to No. 63 of the $SiO_2$—PbO-alkali meal oxide glass of the present invention and Comparative Examples No. A and No. B of the prior art glasses.

Table 11 shows comparison (Comparison III and Comparison IV) between Examples No. 64 and No. 65 of the $SiO_2$—$B_2O_3$-alkali metal oxide and/or alkaline earth metal oxide glass of the present invention and Comparative Examples No. C and No. D of the prior art glasses.

In Tables 1 to 11, Δn (ppm) represents an amount of change in refractive index between a state before radiation and a state after radiation in a portion where radiation of laser beam having beam diameter of 2.0 mm, wavelength of 351 nm, average output power of 0.43 W, pulse repetition rate of 5 kHz and pulse width of 400 ns has been radiated for 1 hour.

Table 12 shows Examples No. 67 to No. 70 of the $SiO_2$—PbO-alkali metal oxide glass of the present invention and Examples No. 71 to No. 73 of the $SiO_2$—$B_2O_3$-alkali metal oxide and/or alkaline earth metal oxide glass of the present invention. Table 13 shows change in refractive index Δn (ppm) between a state before radiation and a state after radiation in a portion where radiation of the above-mentioned laser beam (having wavelength of 351 nm and beam diameter of 2.0 mm) has been made on the glasses shown in Table 12 under conditions of output and radiation time which are different from those of Tables 1 to 11.

TABLE 1

| | (mass %) | | | | | | |
|---|---|---|---|---|---|---|---|
| | 1 | 2 | 3 | 4 | 5 | 6 | 7 |
| $SiO_2$ | 61.390 | 66.000 | 63.000 | 64.800 | 53.200 | 55.880 | 50.200 |
| PbO | 24.800 | 19.890 | 20.200 | 18.500 | 34.600 | 30.200 | 38.200 |
| $Na_2O$ | 9.000 | 6.100 | 6.500 | 9.200 | 6.700 | 6.000 | 5.400 |
| $K_2O$ | 4.000 | 7.700 | 7.900 | 6.700 | 5.200 | 7.600 | 5.400 |
| $As_2O_3$ | 0.200 | 0.300 | | 0.299 | 0.300 | | 0.295 |
| $Sb_2O_3$ | | | 0.100 | | | 0.300 | |
| $Al_2O_3$ | | | 0.400 | | | | |
| $K_2SiF_6$ | | | 1.900 | 0.500 | | | |
| $KHF_2$ | 0.600 | | | | | | |
| $TiO_2$ | 0.010 | 0.010 | | 0.001 | | 0.020 | 0.005 |
| $B_2O_3$ | | | | | | | 0.500 |
| total | 100.000 | 100.000 | 100.000 | 100.000 | 100.000 | 100.000 | 100.000 |
| F | 0.292 | | 0.983 | 0.259 | | | |
| nd | 1.5481 | 1.5317 | 1.5317 | 1.5317 | 1.5814 | 1.5673 | 1.5955 |
| ν d | 45.8 | 49.0 | 49.0 | 49.0 | 40.8 | 42.8 | 39.3 |
| Δ n(ppm) | 3.1 | 3.2 | 2.0 | 2.5 | 4.9 | 3.9 | 4.7 |

TABLE 2

| | (mass %) | | | | | | |
|---|---|---|---|---|---|---|---|
| | 8 | 9 | 10 | 11 | 12 | 13 | 14 |
| $SiO_2$ | 49.700 | 45.500 | 53.100 | 53.100 | 53.100 | 51.995 | 40.000 |
| PbO | 38.200 | 44.900 | 34.700 | 32.700 | 29.700 | 34.000 | 44.800 |
| $Na_2O$ | 10.800 | 4.000 | 5.700 | 6.700 | 6.600 | 6.600 | 5.000 |
| $K_2O$ | | 4.800 | 3.700 | 4.700 | 4.700 | 5.100 | 5.000 |
| $As_2O_3$ | 0.295 | 0.295 | 0.295 | 0.295 | 0.295 | | 0.200 |
| $Sb_2O_3$ | | | | | | 0.300 | |
| $K_2SiF_6$ | | | 0.500 | 0.500 | 0.500 | 2.000 | |
| $KHF_2$ | 1.000 | 0.500 | | | | | |
| $B_2O_3$ | | | | | | | 5.000 |
| $TiO_2$ | 0.005 | 0.005 | 0.005 | 0.005 | 0.005 | 0.005 | |
| $Li_2O$ | | | | 2.000 | | | |
| CaO | | | | | 2.000 | | |
| BaO | | | | | | | 5.000 |
| Total | 100.000 | 100.000 | 100.000 | 100.000 | 100.000 | 100.000 | 100.000 |
| F | 0.486 | 0.243 | 0.259 | 0.259 | 0.259 | 1.035 | |
| nd | 1.5955 | 1.6200 | 1.5866 | 1.5800 | 1.5801 | 1.5717 | 1.6258 |
| ν d | 38.7 | 36.3 | 40.9 | 40.8 | 40.9 | 41.7 | 36.9 |
| Δ n(ppm) | 4.5 | 4.2 | 4.6 | 4.8 | 3.9 | 4.6 | 4.5 |

TABLE 3

| | (mass %) | | | | | |
|---|---|---|---|---|---|---|
| | 15 | 16 | 17 | 18 | 19 | 20 |
| $SiO_2$ | 68.95 | 41.00 | 63.00 | 66.00 | 45.00 | 53.00 |
| PbO | 14.75 | 50.00 | 15.00 | 18.00 | 38.00 | 32.00 |
| $Na_2O$ | 7.90 | 8.50 | 8.70 | 14.00 | | 6.70 |
| $K_2O$ | 5.40 | | 6.00 | | 15.00 | 6.00 |
| $As_2O_3$ | 0.30 | 0.30 | 0.30 | 0.20 | 0.30 | 0.30 |
| $Al_2O_3$ | 1.00 | | 2.00 | | | |
| $K_2SiF_6$ | | | | 1.80 | | |
| $KHF_2$ | 1.20 | 0.20 | | | | |
| $B_2O_3$ | 0.50 | | 5.00 | | 1.70 | |
| SrO | | | | | | 2.00 |
| Total | 100.00 | 100.00 | 100.00 | 100.00 | 100.00 | 100.00 |
| F | 0.58 | 0.10 | | 0.93 | | |
| nd | 1.5094 | 1.6407 | 1.5171 | 1.5271 | 1.5998 | 1.5785 |
| ν d | 55.5 | 34.7 | 54.0 | 50.3 | 38.8 | 41.4 |
| Δ n(ppm) | 2.3 | 4.5 | 3.3 | 2.5 | 4.6 | 4.6 |

TABLE 4

| | (mass %) | | | |
|---|---|---|---|---|
| | 21 | 22 | 23 | 24 |
| $SiO_2$ | 58.80 | 59.74 | 52.64 | 51.65 |
| PbO | 25.05 | 25.00 | 34.80 | 34.77 |
| $Na_2O$ | 9.30 | 9.20 | 6.92 | 6.92 |
| $K_2O$ | 4.80 | 4.70 | 4.34 | 5.35 |
| $As_2O_3$ | 0.20 | 0.20 | 0.10 | 0.10 |
| $Al_2O_3$ | 0.30 | 0.20 | 0.20 | 0.20 |

TABLE 4-continued

| | (mass %) | | | |
|---|---|---|---|---|
| | 21 | 22 | 23 | 24 |
| $K_2SiF_6$ | 1.54 | 0.95 | 1.00 | 1.00 |
| $TiO_2$ | 0.01 | 0.01 | | 0.01 |
| total | 100.00 | 100.00 | 100.00 | 100.00 |
| F | 0.80 | 0.49 | 0.52 | 0.52 |
| nd | 1.5464 | 1.5470 | 1.5790 | 1.5781 |
| ν d | 45.8 | 45.8 | 40.9 | 41.0 |
| Δ n(ppm) | 2.9 | 2.4 | 4.3 | 3.9 |

TABLE 5

| | (mass %) | | | | | | |
|---|---|---|---|---|---|---|---|
| | 25 | 26 | 27 | 28 | 29 | 30 | 31 |
| $SiO_2$ | 64.950 | 55.850 | 55.350 | 42.000 | 35.550 | 30.000 | 68.990 |
| $B_2O_3$ | 14.900 | 13.050 | 6.050 | 13.600 | 16.000 | 20.000 | 11.100 |
| $Al_2O_3$ | 2.300 | 0.500 | 0.600 | 4.200 | 4.500 | 5.500 | |
| $Li_2O$ | | | 3.000 | 2.000 | 2.000 | 2.000 | |
| $Na_2O$ | 9.250 | | 1.200 | 0.300 | 0.300 | | 9.550 |
| $K_2O$ | 6.850 | 11.450 | 8.700 | | | | 7.750 |
| BaO | | | 16.850 | 37.050 | 40.750 | 40.000 | 1.550 |
| ZnO | | | 5.750 | | | | 1.000 |
| PbO | 1.095 | | 2.000 | | 0.500 | | |
| $TiO_2$ | 0.005 | 0.050 | | 0.100 | | | 0.010 |
| $As_2O_3$ | 0.150 | | 0.250 | 0.400 | 0.400 | 0.300 | |
| $Sb_2O_3$ | | 0.010 | 0.250 | | | | 0.050 |
| $K_2SiF_6$ | | 19.090 | | | | | |
| $KHF_2$ | 0.500 | | | 0.350 | | 0.200 | |
| CaO | | | | | | 2.000 | |
| Total | 100.000 | 100.000 | 100.000 | 100.000 | 100.000 | 100.000 | 100.000 |
| F | 0.243 | 9.879 | | 0.170 | | 0.097 | |
| Nd | 1.5163 | 1.4875 | 1.5567 | 1.5891 | 1.6031 | 1.6056 | 1.5163 |
| N d | 64.1 | 70.2 | 58.7 | 61.2 | 60.6 | 61.1 | 64.1 |
| Δ n(ppm) | 0.7 | 0.0 | 0.5 | 0.5 | 0.7 | 0.3 | 0.0 |

TABLE 6

| | (mass %) | | | | | | |
|---|---|---|---|---|---|---|---|
| | 32 | 33 | 34 | 35 | 36 | 37 | 38 |
| $SiO_2$ | 67.20 | 67.80 | 40.00 | 34.55 | 49.00 | 55.80 | 35.50 |
| $B_2O_3$ | 3.60 | 4.10 | 12.30 | 18.00 | 17.90 | 13.05 | 16.00 |
| $Al_2O_3$ | | | 4.50 | 5.50 | 0.30 | 0.50 | 4.50 |
| $Li_2O$ | | | 2.00 | | | | 2.00 |
| $Na_2O$ | 12.50 | 12.10 | 0.30 | 0.30 | | | 0.50 |
| $K_2O$ | 6.13 | 6.15 | | | 12.00 | 11.40 | 0.20 |
| BaO | 10.22 | 9.45 | 38.00 | 38.75 | | | 40.80 |
| PbO | | | | 0.50 | | | |
| $TiO_2$ | | 0.20 | 0.50 | | | 0.04 | 0.10 |
| $As_2O_3$ | 0.35 | | 0.40 | 0.40 | 0.20 | 0.01 | 0.40 |
| $Sb_2O_3$ | | 0.20 | | | | | |
| $K_2SiF_6$ | | | | | | 19.20 | |
| $KHF_2$ | | | | | 20.60 | | |
| SrO | | | | 2.00 | | | |
| $ZrO_2$ | | | 2.00 | | | | |
| Total | 100.00 | 100.00 | 100.00 | 100.00 | 100.00 | 100.00 | 100.00 |
| F | | | | | 10.02 | 9.94 | |
| Nd | 1.5184 | 1.5184 | 1.5962 | 1.5989 | 1.4850 | 1.4860 | 1.6025 |
| N d | 60.3 | 60.3 | 60.5 | 60.3 | 70.1 | 69.7 | 60.5 |
| Δ n(ppm) | 0.4 | 0.2 | 0.4 | 0.3 | 0.1 | 0.1 | 0.5 |

TABLE 7

| (mass %) | 39 | 40 | 41 | 42 | 43 | 44 | 45 | 46 |
|---|---|---|---|---|---|---|---|---|
| $P_2O_5$ | 27.45 | 22.45 | 21.05 | 5.55 | 10.85 | 9.35 | 19.40 | 4.85 |
| $Al_2O_3$ | 6.55 | 5.35 | 5.05 | 1.35 | 2.60 | 2.20 | 3.95 | 1.15 |
| $AlF_3$ | 7.25 | 11.55 | 12.45 | 24.30 | 24.05 | 28.30 | | 27.20 |
| $MgF_2$ | 4.45 | 6.05 | 5.10 | 5.20 | 4.25 | 5.30 | | 4.05 |
| $CaF_2$ | 11.20 | 15.80 | 16.05 | 25.55 | 20.95 | 16.65 | | 20.20 |
| $SrF_2$ | 18.00 | 20.35 | 25.85 | 26.10 | 24.00 | 26.75 | 22.00 | 21.55 |
| $BaF_2$ | 25.10 | 18.45 | 14.45 | 11.80 | 13.20 | 10.65 | 44.50 | 15.00 |
| $YF_3$ | | | | | | | | 5.00 |
| NaF | | | | | 0.10 | | | |
| KF | | | | 0.15 | | | | 1.00 |
| $Y_2O_3$ | | | | | | | 3.00 | |
| $La_2O_3$ | | | | | | | 5.00 | |
| $SnO_2$ | | | | | | | 0.05 | |
| SrO | | | | | | 0.80 | 2.10 | |
| Total | 100.00 | 100.00 | 100.00 | 100.00 | 100.00 | 100.00 | 100.00 | 100.00 |
| F | 23.97 | 29.37 | 30.32 | 42.60 | 39.28 | 40.94 | 16.30 | 42.94 |
| Nd | 1.5296 | 1.5043 | 1.5006 | 1.4353 | 1.4505 | 1.4541 | 1.5632 | 1.4388 |
| N d | 76.2 | 79.4 | 81.1 | 85.5 | 81.6 | 90.5 | 69.8 | 95.1 |
| Δ n(ppm) | 0.0 | 0.0 | 0.0 | 0.0 | 0.0 | 0.0 | 0.2 | 0.0 |

TABLE 8

| (mass %) | 47 | 48 | 49 | 50 | 51 | 52 | 53 | 54 |
|---|---|---|---|---|---|---|---|---|
| $P_2O_5$ | 25.00 | 38.20 | 22.60 | 20.00 | 32.15 | 21.50 | 11.70 | 20.15 |
| $Al_2O_3$ | 6.00 | 8.60 | 5.40 | | 1.80 | 3.30 | 2.80 | 2.55 |
| $AlF_3$ | | | | 10.00 | 7.50 | | 26.50 | 13.75 |
| $MgF_2$ | | | 0.50 | | 2.35 | 8.00 | 4.00 | 4.90 |
| $CaF_2$ | | 9.00 | | 10.00 | 7.00 | 15.00 | 14.00 | 15.40 |
| $SrF_2$ | 15.00 | | 14.00 | 20.00 | 9.20 | 13.00 | 23.00 | 15.85 |
| $BaF_2$ | 28.00 | 22.00 | 47.00 | 20.00 | 25.00 | 22.00 | 12.00 | 15.80 |
| $YF_3$ | | 3.00 | | | | | | |
| $LaF_3$ | 5.00 | | 2.00 | | | | | |
| $GdF_3$ | | | | | | 10.00 | | 2.60 |
| LiF | | | 2.50 | | | | | |
| $Y_2O_3$ | 10.00 | 5.50 | 6.00 | | | | | |
| $La_2O_3$ | 10.00 | 6.20 | | | | | | |
| $Gd_2O_3$ | | 5.00 | | 20.00 | | 5.00 | | |
| $SnO_2$ | 1.00 | | | | | | | |
| MgO | | | | | 5.00 | 2.20 | | |
| CaO | | | | | | | 6.00 | |
| SrO | | | | | | | | 9.00 |
| BaO | | 2.40 | | 10.00 | | | | |
| $As_2O_3$ | | 0.10 | | | | | | |
| Total | 100.00 | 100.00 | 100.00 | 100.00 | 100.00 | 100.00 | 100.00 | 100.00 |
| F | 12.06 | 16.83 | 17.14 | 22.04 | 22.21 | 23.54 | 36.80 | 28.73 |
| Nd | 1.5826 | 1.5913 | 1.5583 | 1.5783 | 1.5532 | 1.5022 | 1.4565 | 1.4973 |
| N d | 70.3 | 72.6 | 70.6 | 72.0 | 71.2 | 79.2 | 90.1 | 80.9 |
| Δ n(ppm) | 0.1 | 0.0 | 0.0 | 0.1 | 0.1 | 0.1 | 0.1 | 0.2 |

TABLE 9

| (mass %) | 55 | 56 | 57 | 58 | 59 |
|---|---|---|---|---|---|
| $P_2O_5$ | 4.00 | 25.00 | 25.00 | 11.70 | 24.00 |
| $Al_2O_3$ | 1.00 | 7.00 | 6.00 | 2.80 | 6.00 |
| $AlF_3$ | 27.00 | | | 25.50 | |
| $MgF_2$ | 5.00 | | | 4.50 | 2.00 |
| $CaF_2$ | 21.00 | | 5.00 | 13.50 | 2.00 |
| $SrF_2$ | 21.00 | 15.00 | 15.00 | 22.50 | 13.00 |
| $BaF_2$ | 16.00 | 19.00 | 23.00 | 12.50 | 27.00 |
| $YF_3$ | 5.00 | 10.00 | | | |
| $LaF_3$ | | 5.00 | 10.00 | | 5.00 |
| NaF | | | | 1.00 | |
| $Y_2O_3$ | | | 10.00 | | 5.00 |
| $La_2O_3$ | | 10.00 | | | 5.00 |
| $Gd_2O_3$ | | | 5.00 | | |
| $Yb_2O_3$ | | | | | 10.00 |
| CaO | | | | 6.00 | |
| SrO | | | 1.00 | | |
| BaO | | 9.00 | | | 1.00 |
| Total | 100.00 | 100.00 | 100.00 | 100.00 | 100.00 |
| F | 37.52 | 29.12 | 14.87 | 36.59 | 13.13 |
| Nd | 1.4378 | 1.5816 | 1.5822 | 1.4562 | 1.5820 |
| υd | 97.1 | 70.2 | 69.9 | 90.0 | 70.1 |
| Δ n(ppm) | 0.1 | 0.1 | 0.2 | 0.1 | 0.1 |

TABLE 10

| | (mass %) | | | | | | |
|---|---|---|---|---|---|---|---|
| | Comparison I | | | Comparison II | | | |
| | 59 | 60 | Com. Ex. A | 61 | 62 | 63 | Com. Ex. B |
| SiO$_2$ | 63.00 | 65.30 | 66.00 | 53.10 | 53.05 | 52.00 | 53.10 |
| PbO | 20.20 | 18.50 | 19.90 | 34.70 | 34.70 | 34.00 | 34.70 |
| Na$_2$O | 6.50 | 9.20 | 6.10 | 6.70 | 6.70 | 6.60 | 6.70 |
| K$_2$O | 7.90 | 6.70 | 7.70 | 5.20 | 5.20 | 5.10 | 5.20 |
| As$_2$O$_3$ | | 0.30 | | 0.30 | | 0.30 | |
| Sb$_2$O$_3$ | 0.10 | | 0.30 | | 0.30 | | 0.30 |
| Al$_2$O$_3$ | 0.40 | | | | | | |
| K$_2$SiF$_6$ | 1.90 | | | | | 2.00 | |
| TiO$_2$ | | | | | 0.05 | | |
| total | 100.00 | 100.00 | 100.00 | 100.00 | 100.00 | 100.00 | 100.00 |
| F | 0.98 | | | | | 1.04 | |
| Nd | 1.5317 | 1.5317 | 1.5317 | 1.5786 | 1.5801 | 1.5717 | 1.5800 |
| ν d | 49.0 | 49.0 | 49.0 | 41.0 | 40.9 | 41.7 | 40.8 |
| Δ n(ppm) | 2.9 | 3.4 | 6.3 | 4.9 | 4.5 | 4.2 | 10.0 |

TABLE 11

| | (mass %) | | | |
|---|---|---|---|---|
| | Comparison III | | Comparison IV | |
| | 64 | Com. Ex. C | 65 | Com. Ex. D |
| SiO$_2$ | 67.80 | 67.20 | 68.99 | 64.95 |
| B$_2$O$_3$ | 4.10 | 3.60 | 11.10 | 14.90 |
| Al$_2$O$_3$ | | | | 2.30 |
| Na$_2$O | 12.10 | 12.50 | 9.55 | 9.25 |
| K$_2$O | 6.15 | 6.13 | 7.75 | 6.85 |
| BaO | 9.45 | 10.22 | 1.55 | |
| ZnO | | | 1.00 | |
| PbO | | | | 1.60 |
| TiO$_2$ | 0.20 | | 0.01 | |
| Sb$_2$O$_3$ | 0.20 | 0.35 | 0.05 | 0.15 |
| Total | 100.00 | 100.00 | 100.00 | 100.00 |
| Nd | 1.5184 | 1.5184 | 1.5163 | 1.5163 |
| ν d | 60.3 | 60.3 | 64.1 | 64.1 |
| Δ n(ppm) | 0.2 | 6.0 | 0.0 | 7.0 |

TABLE 13

| No. | | | | | | | | | |
|---|---|---|---|---|---|---|---|---|---|
| Average Output | | | (mass %) Δ n (ppm) | | | | | | |
| Power(W) | Time | 66 | 67 | 68 | 69 | 70 | 71 | 72 |
| 0.10 | 165 hrs | 0.2 | | | | | | |
| 0.60 | 10 min. | 0.3 | | | | | | |
| 0.60 | 15 min. | 0.3 | | | | | | |
| 0.60 | 30 min. | 0.5 | | | | | | |
| 0.60 | 1 hour | 0.5 | | | | | | |
| 0.60 | 10 min. | | 0.6 | | | | | |
| 0.60 | 1 hour | | 1.1 | | | | | |
| 2.00 | 10 min. | | | 0.7 | | | | |
| 1.20 | 15 min. | | | 1.0 | | | | |
| 2.00 | 25 min. | | | 1.6 | | | | |
| 2.00 | 10 min. | | | | 0.5 | | | |
| 1.20 | 15 min. | | | | 0.8 | | | |
| 2.00 | 25 min. | | | | 1.3 | | | |
| 1.50 | 3 hrs | | | | | 0.0 | | |
| 2.65 | 3 hrs. | | | | | | 0.5 | |
| 2.65 | 3 hrs. | | | | | | | 0.6 |

TABLE 12

| | (mass %) | | | | | | |
|---|---|---|---|---|---|---|---|
| No. | 66 | 67 | 68 | 69 | 70 | 71 | 72 |
| SiO$_2$ | 63.20 | 65.48 | 51.62 | 51.62 | 57.85 | 68.50 | 69.34 |
| B$_2$O$_3$ | | | | | 13.52 | 3.99 | 11.11 |
| PbO | 20.33 | 20.27 | 34.80 | 34.80 | | | |
| K$_2$O | 7.96 | 7.79 | 5.35 | 5.35 | 11.85 | 6.00 | 7.76 |
| Na$_2$O | 6.51 | 6.18 | 6.93 | 6.92 | | 11.85 | 9.55 |
| Al$_2$O$_3$ | 0.37 | | 0.20 | 0.20 | 0.50 | | |
| K$_2$SiF$_6$ | 1.53 | | 1.00 | 1.00 | 16.23 | | |
| As$_2$O$_3$ | | 0.28 | 0.10 | 0.10 | 0.01 | 0.20 | 0.03 |
| Sb$_2$O$_3$ | 0.10 | | | | | | |
| TiO$_2$ | | | | 0.01 | 0.04 | 0.20 | 0.01 |
| BaO | | | | | | 9.26 | 1.19 |
| ZnO | | | | | | | 1.01 |
| total | 100.00 | 100.00 | 100.00 | 100.00 | 100.00 | 100.00 | 100.00 |
| F | 0.79 | | 0.52 | 0.52 | 8.40 | | |
| nd | 1.53168 | 1.53145 | 1.57904 | 1.57807 | 1.48713 | 1.51820 | 1.51593 |
| ν d | 48.9 | 49.0 | 40.9 | 41.0 | 70.2 | 60.3 | 64.1 |

As shown in Tables 1 to 12, the amount of change Δn in a period between before and after radiation of laser beam in the glasses of Examples No. 1 to No. 73 is 5 ppm or below. The glasses of Examples No. 60 to No. 66 shown in Tables 10 and 11 all have a smaller amount of change (Δn) in a period between before and after radiation of laser beam than the prior art glasses of Comparative Examples No. A to No. D which have similar contents of $SiO_2$, PbO, $B_2O_3$, alkali metal oxide and BaO as well as similar values of nd and vd to these Examples of the invention and, thus, show the advantageous effects of containing the fluorine ingredient and/or the titanium oxide ingredeint and/or the arsenic oxide ingredient.

The glasses of the above described examples of the invention can be easily manufactured by weighing and mixing optical glass materials such as oxides, carbonates, nitrates, hydroxides, phosphates and fluorides, melting the materials at 900-1500° C. for about 3 hours to 10 hours in a platinum container and/or a quartz container and thereafter refining, stirring, and homogenizing the melt and cooling the melt to a predetermined temperature, and casting it in a preheated mold and annealing it.

In summing up, the optical glass of the present invention is an optical glass wherein an amount of change in refractive index (Δn: difference in refractive index between a state before radiation and a state after radiation) caused by radiation of laser beam at wavelength of 351 nm having average output power of 0.43 W, pulse repetition rate of 5 kHz and pulse width of 400 ns for one hour is 5 ppm or below.

It is also an optical glass comprising a fluorine ingredient and/or a titanium oxide ingredient and/or an arsenic oxide ingredient. It is also a $SiO_2$—PbO-alkali metal oxide glass containing a fluorine ingredient and/or a titanium oxide ingredient and/or an arsenic oxide ingredient respectively of a specific composition range, or a $SiO_2$—$B_2O_3$-alkali metal oxide and/or alkaline earth metal oxide glass containing a fluorine ingredient and/or a titanium oxide ingredient and/or an arsenic oxide ingredient respectively of a specific composition range, or a $P_2O_5$—$Al_2O_3$-alkaline earth metal fluoride glass containing a fluorine ingredient and/or a titanium oxide ingredient and/or an arsenic oxide ingredient respectively of a specific composition range. In the optical glasses of the present invention, an amount of change (Δn) in refractive index in a portion where ultraviolet ray or laser beam of a wavelength in the range from 300 nm to 400 nm having a high level has been radiated is very small. Accordingly, by using the optical glass of the present invention in a high-precision optical system using light of a high energy density such as high level ultraviolet ray and laser beam in the wavelength reion of 300 nm to 400 nm, deterioration in homogeneity of the glass, increase in distortion in the image or deformation in the surface shape of the glass hardly takes place and, therefore distortion or bleeding in the image hardly takes place. For these reasons, the optical glass of the invention is very useful. By using, for example, the optical glass of the invention for lenses of an optical system or lighting system of an i-line stepper, exposure and copying of a highly integrated LSI pattern can be made with a high resolution.

What is claimed is:

1. An optical glass having optical constants of a refractive index (nd) within a range from 1.49 to 1.6, comprising, in mass %,

| | |
|---|---|
| $P_2O_5$ | 4-39% |
| $Al_2O_3$ | 0-9% |
| MgO | 0-5% |
| CaO | 0-6% |
| SrO | 0-9% |
| BaO | 0-10% |
| $Y_2O_3$ + $La_2O_3$ + $Gd_2O_3$ + $Yb_2O_3$ in the total amount of | 0-20% |
| Where | |
| $Y_2O_3$ | 0-10% |
| $La_2O_3$ | 0-10% |
| and | |
| $Yb_2O_3$ | 0-10% |
| $TiO_2$ | 0-0.1% |
| $SnO_2$ | 0-1% |
| $As_2O_3$ | 0-0.5% |
| $Sb_2O_3$ | 0-0.5% |
| $AlF_3$ | 0-29% |
| $MgF_2$ | 0-8% |
| $CaF_2$ | 0-27% |
| $SrF_2$ | 0-27% |
| $BaF_2$ | 10-47% |
| $YF_3$ | 0-10% |
| $LaF_3$ | 0-10% |
| $GdF_3$ | 0-10% |
| LiF | 0-3% |
| NaF | 0-0.1% |
| KF | 0-1% | the total amount of F in one or more of the fluorides being 22-45% and the total amount of one or more of $MgF_2$, $CaF_2$, $SrF_2$ and $BaF_2$ being 30-70%.

2. An optical glass as defined in claim 1 wherein an amount of change in refractive index (Δn: difference in refractive index between a state before radiation and a state after radiation) caused by radiation of laser beam at wavelength of 351 nm having average output power of 0.43 W, pulse repetition rate of 5 kHz and pulse width of 400 ns for one hour is 5 ppm or below.

3. An optical glass having optical constants of an Abbe number (vd) within a range from 69 to 82, comprising, in mass %,

| | |
|---|---|
| $P_2O_5$ | 4-39% |
| $Al_2O_3$ | 0-9% |
| MgO | 0-5% |
| CaO | 0-6% |
| SrO | 0-9% |
| BaO | 0-10% |
| $Y_2O_3$ + $La_2O_3$ + $Gd_2O_3$ + $Yb_2O_3$ in the total amount of | 0-20% |
| Where | |
| $Y_2O_3$ | 0-10% |
| $La_2O_3$ | 0-10% |
| and | |
| $Yb_2O_3$ | 0-10% |
| $TiO_2$ | 0-0.1% |
| $SnO_2$ | 0-1% |
| $As_2O_3$ | 0-0.5% |
| $Sb_2O_3$ | 0-0.5% |
| $AlF_3$ | 0-29% |
| $MgF_2$ | 0-8% |
| $CaF_2$ | 0-27% |
| $SrF_2$ | 0-27% |
| $BaF_2$ | 10-47% |
| $YF_3$ | 0-10% |
| $LaF_3$ | 0-10% |
| $GdF_3$ | 0-10% |
| LiF | 0-3% |
| NaF | 0-0.1% |
| KF | 0-1% | the total amount of F in one or more of the fluorides being 22-45% and the total amount of one or more of $MgF_2$, $CaF_2$, $SrF_2$ and $BaF_2$ being 30-70%.

4. An optical glass as defined in claim 3 wherein an amount of change in refractive index (Δn: difference in refractive index between a state before radiation and a state after radiation) caused by radiation of laser beam at wavelength of 351 nm having average output power of 0.43 W, pulse repetition rate of 5 kHz and pulse width of 400 ns for one hour is 5 ppm or below.

5. An optical glass having optical constants of an Abbe number (νd) within a range from 95.1 to 97.1, comprising, in mass %,

| | |
|---|---|
| $P_2O_5$ | 4-39% |
| $Al_2O_3$ | 0-9% |
| MgO | 0-5% |
| CaO | 0-6% |
| SrO | 0-9% |
| BaO | 0-10% |
| $Y_2O_3 + La_2O_3 + Gd_2O_3 + Yb_2O_3$ in the total amount of | 0-20% |
| Where | |
| $Y_2O_3$ | 0-10% |
| $La_2O_3$ | 0-10% |
| and | |
| $Yb_2O_3$ | 0-10% |
| $TiO_2$ | 0-0.1% |
| $SnO_2$ | 0-1% |
| $As_2O_3$ | 0-0.5% |
| $Sb_2O_3$ | 0-0.5% |
| $AlF_3$ | 0-28.3% |
| $MgF_2$ | 0-8% |
| $CaF_2$ | 0-27% |
| $SrF_2$ | 0-27% |
| $BaF_2$ | 10-47% |
| $YF_3$ | 0-10% |
| $LaF_3$ | 0-10% |
| $GdF_3$ | 0-10% |
| LiF | 0-3% |
| NaF | 0-1% |
| KF | 0-1% | the total amount of F in one or more of the fluorides being 10-45% and the total amount of one or more of $MgF_2$, $CaF_2$, $SrF_2$ and $BaF_2$ being 30-70%.

6. An optical glass as defined in claim 5 wherein an amount of change in refractive index (Δn: difference in refractive index between a state before radiation and a state after radiation) caused by radiation of laser beam at wavelength of 351 nm having average output power of 0.43 W, pulse repetition rate of 5 kHz and pulse width of 400 ns for one hour is 5 ppm or below.

7. A method of providing an optical glass for lenses of an optical system of an i-line stepper, said method comprising utilizing in said i-line stepper a lens made from an optical glass comprising, in mass %,

| | |
|---|---|
| $P_2O_5$ | 4-39% |
| $Al_2O_3$ | 0-9% |
| MgO | 0-5% |
| CaO | 0-6% |
| SrO | 0-9% |
| BaO | 0-10% |
| $Y_2O_3 + La_2O_3 + Gd_2O_3 + Yb_2O_3$ in the total amount of | 0-20% |
| Where | |
| $Y_2O_3$ | 0-10% |
| $La_2O_3$ | 0-10% |
| $Gd_2O_3$ | 0-20% |
| and | |
| $Yb_2O_3$ | 0-10% |
| $TiO_2$ | 0-0.1% |
| $SnO_2$ | 0-1% |
| $As_2O_3$ | 0-0.5% |
| $Sb_2O_3$ | 0-0.5% |
| $AlF_3$ | 0-29% |
| $MgF_2$ | 0-8% |
| $CaF_2$ | 0-27% |
| $SrF_2$ | 0-27% |
| $BaF_2$ | 10-47% |
| $YF_3$ | 0-10% |
| $LaF_3$ | 0-10% |
| $GdF_3$ | 0-10% |
| LiF | 0-3% |
| NaF | 0-1% |
| KF | 0-1% | the total amount of F in one or more of the fluorides being 10-45% and the total amount of one or more of $MgF_2$, $CaF_2$, $SrF_2$ and $BaF_2$ being 30-70%.

\* \* \* \* \*